United States Patent [19]

Hartleroad et al.

[11] 3,887,998

[45] June 10, 1975

[54] AIR-BIASED PROBE FOR SEMICONDUCTOR DEVICE BONDING

[75] Inventors: Ronald J. Hartleroad, Twelve Mile; James P. Grabowski, Carmel, both of Ind.

[73] Assignee: General Motors Corporation, Detroit, Mich.

[22] Filed: Apr. 4, 1974

[21] Appl. No.: 458,004

Related U.S. Application Data

[63] Continuation-in-part of Ser. No. 414,521, Nov. 9, 1973, abandoned.

[52] U.S. Cl. .................. 29/589; 29/471.1; 228/6; 214/1; 29/203 P

[51] Int. Cl. .................. B01j 17/00

[58] Field of Search .......... 29/589, 590, 591, 471.1, 29/628, 203 P; 214/1 BE; 228/6

[56] References Cited

UNITED STATES PATENTS

| | | | |
|---|---|---|---|
| 3,341,030 | 9/1967 | Engels | 214/1 |
| 3,612,955 | 10/1971 | Butherus | 29/589 |
| 3,722,072 | 3/1973 | Beyerlein | 29/589 |
| 3,731,377 | 5/1973 | Muckelroy | 29/471.1 |

*Primary Examiner*—Roy Lake
*Assistant Examiner*—W. C. Tupman
*Attorney, Agent, or Firm*—Robert J. Wallace

[57] ABSTRACT

A method and apparatus for transferring integrally leaded semiconductor device chips from a temporary carrier to an overlying conductive lead frame in which the chips can be consistently reliably bonded thereto on a mass production basis without overstressing the lead frame fingers. A chip is elevated on a probe close to the underside of the lead frame fingers. A magnetic force raises the chip off the probe to the lead frame fingers and aligns the chip therewith. The chip is bonded with a hot gas blast. Means are provided to back up the chip with a predetermined uniform probe load during bonding, regardless as to nonuniformities in chip thickness and lead frame nonplanarity.

4 Claims, 8 Drawing Figures

AIR-BIASED PROBE FOR SEMICONDUCTOR DEVICE BONDING

CROSS REFERENCE TO RELATED APPLICATIONS

This application is a continuation-in-part of copending United States application, Ser. No. 414,521, entitled "Air-Biased Probe for Semiconductor Device Bonding," filed Nov. 9, 1973, now abandoned.

BACKGROUND OF THE INVENTION

This invention relates to a method and apparatus for transferring integrally leaded semiconductor device chips to conductive lead frames for bonding thereto. More particularly, it involves a distinctive transfer apparatus and method which increases the productivity of the inventions described and claimed in the pending United States patent applications Ser. No. 414,274 entitled "Magnetic Alignment for Semiconductor Device Bonding," Hartleroad et al., and Ser. No. 414,501 entitled "Laminated Template for Semiconductor Device Bonding," Hartleroad et al., which are assigned to the assignee of this invention.

United States patent application Ser. No. 414,274 discloses a unique method and apparatus for magnetically transferring a semiconductor device chip to a conductive lead frame and simultaneously aligning the chip with lead frame fingers. The chip has soft ferromagnetic integral leads. It is placed on a soft ferromagnetic probe. The probe is raised close to the underside of soft ferromagnetic finger portions of an overlying conductive lead frame. A magnetic force applied to the probe raises the chip up off the probe into engagement with the lead frame fingers. Concurrently, the integral leads on the chip automatically orient precisely with the soft ferromagnetic lead frame fingers so that they can be accurately bonded thereto.

United States patent application Ser. No. 414,501 discloses a chip positioning template that facilitates use of the above-described invention on a commercial production basis. It describes a template having a plurality of recesses into each of which one chip is placed. A thin soft ferromagnetic lead frame having a plurality of finger sets is clamped against the template upper surface with a cover plate. A set of fingers overlies each chip. The recesses generally align the integral soft ferromagnetic leads on the chips with their corresponding fingers of the lead frame. Each recess has an opening beneath it. The probe of the aforesaid transfer apparatus can pass through the recess opening to engage the backside of the chip in the recess. The probe raises the chip from the recess into close proximity with the overlying finger sets for the aforementioned magnetic alignment and transfer to occur. Once the chip is aligned and transferred to the lead frame fingers, a hot gas can be used to permanently bond the two together. United States patent application Ser. No. 414,501 also discloses a unique laminated template that provides better general chip-finger alignment as well as better parallelism between the two for improved yields under commercial production conditions.

We have now found that the productivity of this method and apparatus can be improved even further. We have discovered that improved yields and production rates can be obtained if the chip is backed up by the probe during bonding by a hot gas blast. However, it was not apparent how chip backup could be implemented on a production basis. Overstressing of the lead frame fingers during chip backup must be avoided. Overstressed lead frame fingers can significantly reduce the reliability of the chip-lead frame finger bond. We have found that extended lengths of a template-lead frame-cover assembly is often not precisely planar or even mutually parallel, even with the aforementioned laminated template. This results in random variations in lead frame elevation with respect to the top of the probe. Variations in effective chip thickness can aggravate this problem. Consequently, a constant automatic probe elevation cannot be used for chip backup during hot gas bonding. Lead frame fingers at some locations will be overstressed, while at other locations the chips may not even be backed up at all. Manual compensation by visual means is impractical from a production standpoint, for a variety of reasons. On the other hand, despite these difficulties, we have found automatic means for applying chip backup during bonding. Not only are yields and reliability of the resultant product improved but the production rates can be increased.

OBJECTS AND SUMMARY OF THE INVENTION

Therefore, it is an object of this invention to provide a method and apparatus for more consistently and reliably bonding integrally leaded semiconductor device chips magnetically raised to corresponding fingers of an overlying lead frame. It is also an object of this invention to provide a more productive method and apparatus for bonding integrally leaded semiconductor device chips magnetically raised from a temporary carrier to an overlying lead frame for bonding.

These and other objects of the invention are achieved by placing a semiconductor device chip in each of a plurality of recesses in one surface of a chip-carrying template. The chips have soft ferromagnetic integral leads on one face thereof. Each template recess has an opening extending up to it from the bottom of the template. A soft ferromagnetic conductive lead frame supported on the template has a finger set overlying the chips in the recesses. An elevatable electromagnet below the carrier has an upwardly extending soft ferromagnetic probe for successive insertion in each template recess opening. The probe is slidably mounted within a chamber and upwardly biased by air pressure. The electromagnet is raised to insert the probe into a template recess opening and engage the chip therein. As the electromagnet is further vertically raised, the probe raises the chip from the template recess into close proximity with its respective overlying lead frame finger set. A magnetic force from the electromagnet is transmitted through the probe to raise the chip up off the probe to the lead frame finger set and automatically orient the chip therewith. The electromagnet is raised further until the probe re-engages the backside of the chip to hold it in register with the lead frame fingers. A hot gas blast is used to bond the chip to the finger set. Excessive elevation of the electromagnet is compensated by regression of the probe into its chamber against the air pressure applied to it. A predetermined force is thus applied to the chip bottom so that chip-finger registration is not disturbed by the hot gas blast, yet the probe force does not overstress the lead frame fingers. In a preferred embodiment, the electromagnet has a plurality of probes to permit backup of a plurality of chips for simultaneous bonding.

DESCRIPTION OF THE PREFERRED EMBODIMENT

Figure 1:
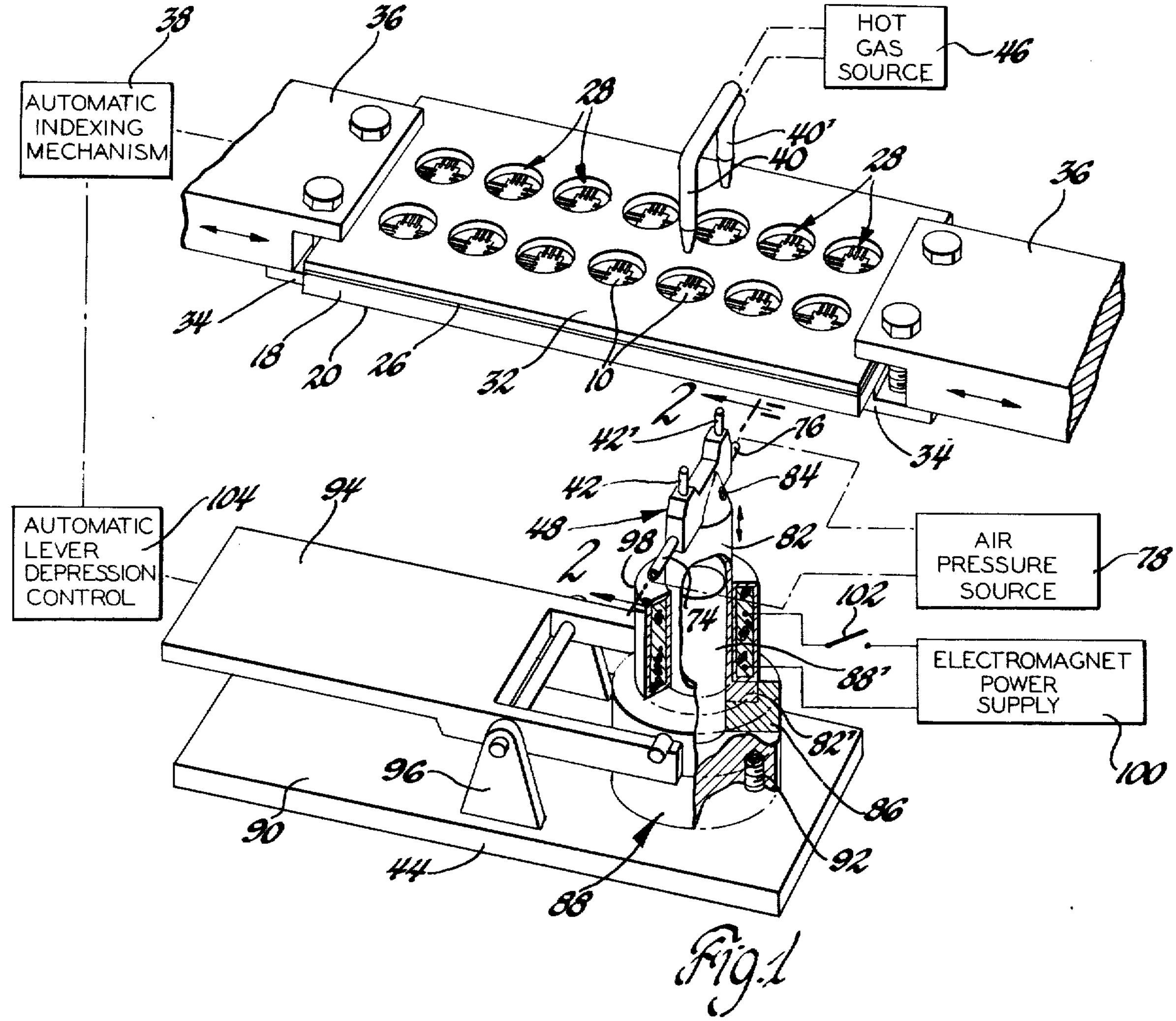
FIG. 1 shows an isometric view with parts broken away of an apparatus made in accordance with this invention.
Figure 2:
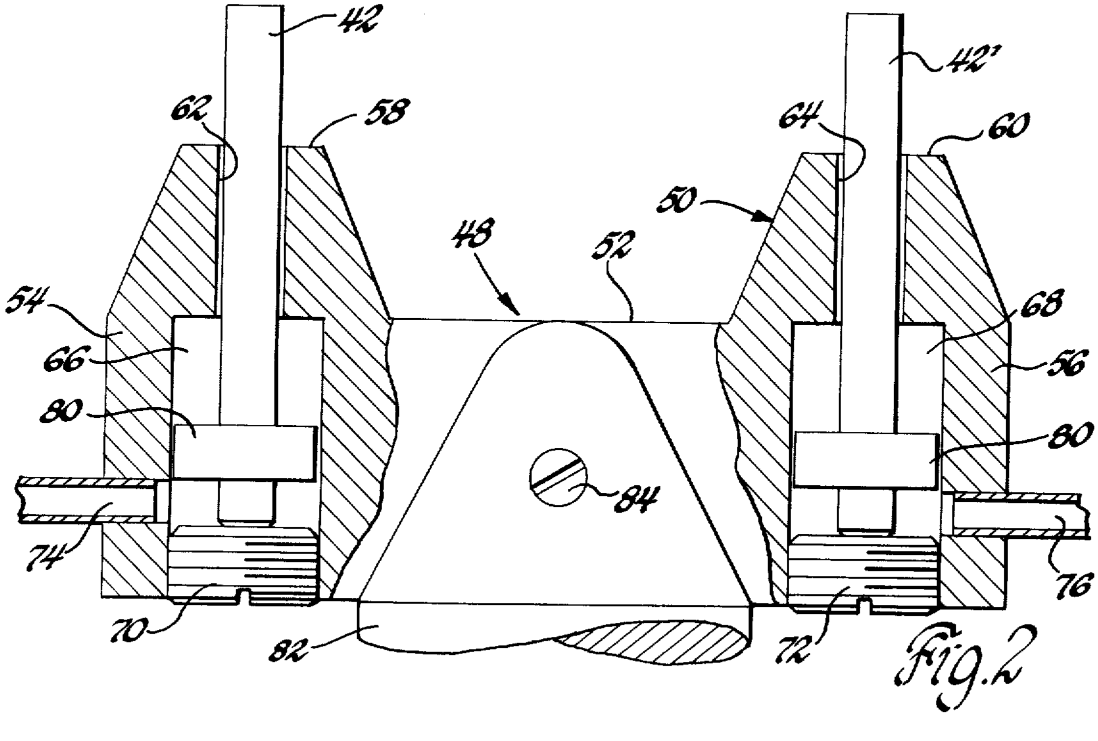
FIG. 2 shows an enlarged fragmentary sectional view in partial elevation along the lines 2—2 of FIG. 1.

Referring now to the drawings, flip chips 10 are silicon semiconductor integrated circuit device dies approximately 38 mils square and 11 to 13 mils thick between its two major faces. Each flip chip 10 has a dozen spaced apart contact bumps 12 on its upper major face equally spaced about its periphery. Each individual contact bump is approximately 0.75 – 0.85 mil high and 3.8 mils square. For ease of illustration the contact bumps are shown enlarged with respect to the chip 10. Contact bumps are a composite of successive layers of aluminum, chromium, nickel, tin and gold, with the outermost layer being gold to permit making a eutectic bond with a gold plated lead frame. While the foregoing bump construction is preferred, it can be varied. However, the nickel content should be at least about 30% and preferably about 60% by volume of the total contact bump volume, as is the case in this example.

As described in the aforementioned United States patent application Ser. No. 414,274, the nickel content provides a low reluctance path by which magnetic flux lines can easily pass through the contact bumps. The greater than 30% by volume nickel in effect gives the contact bumps characteristics of a soft ferromagnetic material. By soft ferromagnetic material, we mean a material having a high overall permeability and a low residual magnetization, with a low coercive field required. It should be noted that although nickel has been found to be the most practical metal to be used in production, other metals such as soft iron may be substituted therefor. However, if so, different volumes may be preferred.

Each of the flip chips 10 is situated in a recess 14 within a major surface 16 of template 18. Template 18 serves as a temporary semiconductor chip carrier and has two major parallel surfaces 16 and 20. Template 18 is a rigid body of stainless steel which is approximately 10¼ inches long, 3¼ inches wide, and three thirty-seconds inch thick. The recesses 14 are located in spaced rows and columns within the template surface 16 and have bottom portions 22 which are substantially parallel to the major surfaces of the template. Each recess 14 has a cylindrical opening 24 extending from the bottom portion 22 to template surface 20. Template 18 can be laminated, as described in the previously mentioned United States patent application Ser. No. 414,501.

A conductive lead frame 26 rests on the upper surface of template 18 and is aligned therewith. Lead frame 26 is of a soft ferromagnetic material such as Alloy 42 and has a thin layer of gold (not shown) on both of its major faces. Alloy 42 is an alloy containing, by weight, about 41.5% nickel, 0.05% carbon, 0.5% manganese, 0.25% silicon, and the balance iron. Lead frame 26 has a length and width approximately the same as that of template 18 and has a thickness of about 25 mils. Lead frame 26 has a plurality of sets 28 of mutually spaced inwardly convergent cantilevered fingers 30, with the sets being spaced from each other and arranged so as to correspond to template recesses 14. The fingers in each set have free inner ends 30' arranged in a predetermined pattern which corresponds to the pattern of contact bumps 12 on semiconductor flip chip 10 below it.

The gold plated Alloy 42 lead frame has provided extremely satisfactory eutectic bonding results. However, as mentioned in United States patent application Ser. No. 414,274, other bonding, such as solder bonding, can be used. The solder can be supplied by a lead frame or contact bump coating, or both. Also, it appears that the lead frame fingers must be of a soft ferromagnetic material.

A cover plate 32 on the top side of the lead frame holds the lead frame against the top of the template 18. Cover plate 32 is generally coextensive with the lead frame 26 and is constructed of SAE 300 series stainless steel. Cover plate 32 has a plurality of circular openings therein, with one opening concentric each set 28 of the lead frame fingers. It should be noted that deviations in template-lead frame-cover plate planarity and parallelism are not shown in the drawings. Instead, in FIGS. 3 – 7 chips 10 and 10' of exaggerated different thickness are shown in adjacent template recesses 14 and 14' to better illustrate how our apparatus and method can accommodate such problems.

The template 18, lead frame 26, and cover plate 32 are held together in mutual registration by means of clamps 34 on the ends of arm 36 as can be seen in FIG. 1. The arms 36 are connected to supporting automatic indexing mechanism 38 as shown in FIG. 1. The automatic indexing mechanism 38 successively positions template-lead frame subassemblies so that openings 24 and 24' of adjacent template recesses 14 and 14' are vertically aligned between the outlets of hot gas tubes 40 and 40' and the probes 42 and 42' of transfer apparatus 44. The hot gas tubes 40 and 40' are connected to a source 46 as shown in FIG. 1. It should be noted that while the hot gas tubes are shown stationary in FIG. 1 for convenience, they can be movable.

Particular attention is now drawn to the probe holder assembly 48, which has support portions essentially the same as that disclosed and referred to as the transfer apparatus in United States patent application Ser. No. 414,274. The probe holder assembly 48 has a soft ferromagnetic housing 50 of hot or cold rolled steel. The housing 50 has a web portion 52 which integrally supports two horizontally spaced air cylinders 54 and 56. The air cylinders 54 and 56 have tapered upper end portions 58 and 60, respectively, which are spaced apart approximately the distance between the recesses 14 and 14' of template 18. End portions 58 and 60 have cylindrical orifices 62 and 64 which extend to enlarged cylindrical chambers 66 and 68, respectively. Each chamber 66 and 68 is approximately three-eighths inch long and one-eighth inch in diameter. The orifices 62 and 64 are about 40 mils in diameter and spaced apart so that they are concentric with openings 24 and 24' in the template 18. The hollow chambers 66 and 68 are closed at their lower ends by studs 70 and 72.

No. 21 gauge hollow air ducts 74 and 76 extend from the opposite sides of the housing 50 into chambers 66 and 68, respectively. The air ducts 74 and 76 are connected by flexible tubing to an air pressure source 78. The air pressure source 78 supplies an air pressure of about 10 to 20 psi to respective chambers 66 and 68, with 15 psi being preferred.

Probes 42 and 42' are slidably mounted within orifices 62 and 64. The probes are constructed of a soft ferromagnetic material, such as soft iron. The diameter of the probe is about 34 mils which is approximately 6 mils less than the diameter of the orifices in which they are located. This allows for some degree of horizontal as well as rotational freedom therewithin. Moreover, this allows some of the air pressure to escape from the chambers around the probe. A brass collar 80 surrounds the lower portion of each of the probes 42 and 42'. The collar 80 is press fit around the probes and, similarly, has a diameter which is approximately 6 mils less than that of the respective surrounding chamber. The collars 80 provide a piston-like surface so that air pressure introduced into the chamber vertically biases the probes, so that the probes effectively float on a cushion of air. Moreover, the brass comprising the collar is substantially nonferromagnetic. Hence, the collar will not be attracted to the soft ferromagnetic housing when the magnetic field has been applied.

The probe holder assembly 48 is mounted in a vertical slot in the top of the probe holder 82 by screw 84 so that the probes extend substantially vertically therefrom. As mentioned in United States patent application Ser. No. 414,274, the probe holder is constructed of a soft ferromagnetic material and has a lower flange portion 82' which is seated within a groove on the upper surface of an elevator base 86. The major longitudinal portion of probe holder 82 and the elevator base 86 have a concentric longitudinal cylindrical opening to receive the cylindrical upper end of 88' of base guide 88. The probe holder and elevator base are fitted around the base guide end 88' so that they slide easily vertically therealong without substantial horizontal deviation. The base guide 88 has a flange portion at its lower end which is secured to an aluminum mounting plate 90 as by screws 92. The upper surface of the base guide flange serves as a seat for the lower end of elevator base 86. Elevator base 86 has two oppositely disposed and radially extended bosses which rest on a yoke portion of lever arm 94. Lever arm 94 is pivotally mounted to fulcrum 96 which is attached to mounting plate 90.

An electromagnet coil 98 encircles the periphery of the probe holder 82. The coil 98 is 1⅛ inch long and is constructed of No. 36 gauge enamel copper wire, 63 turns long and 10 turns deep. Coil 98 in conjunction with the probe holder 82 forms an electromagnet. The coil is series connected to a power supply 100 through a switch 102. Preferably, the power supply supplies an average of 15 volts and 0.45 ampere.

An automatic lever depression control 104 provides a downward force to the lever arm 94 to raise the probe assembly 48 and rigidly connected members of the transfer apparatus. The automatic lever depression control 104 coacts with the automatic indexing mechanism 38 so that the lever arm 94 is slowly depressed at selected intervals as will later be understood. It should be noted that the lever arm can be depressed manually. Even so, there is no need for manual compensation of probe lift between the various bonding sites due to lead frame nonplanarity, differences in chip thickness, etc. These aspects of the invention will become more understood with regards to the method description of the invention that will now follow.

Figure 3:
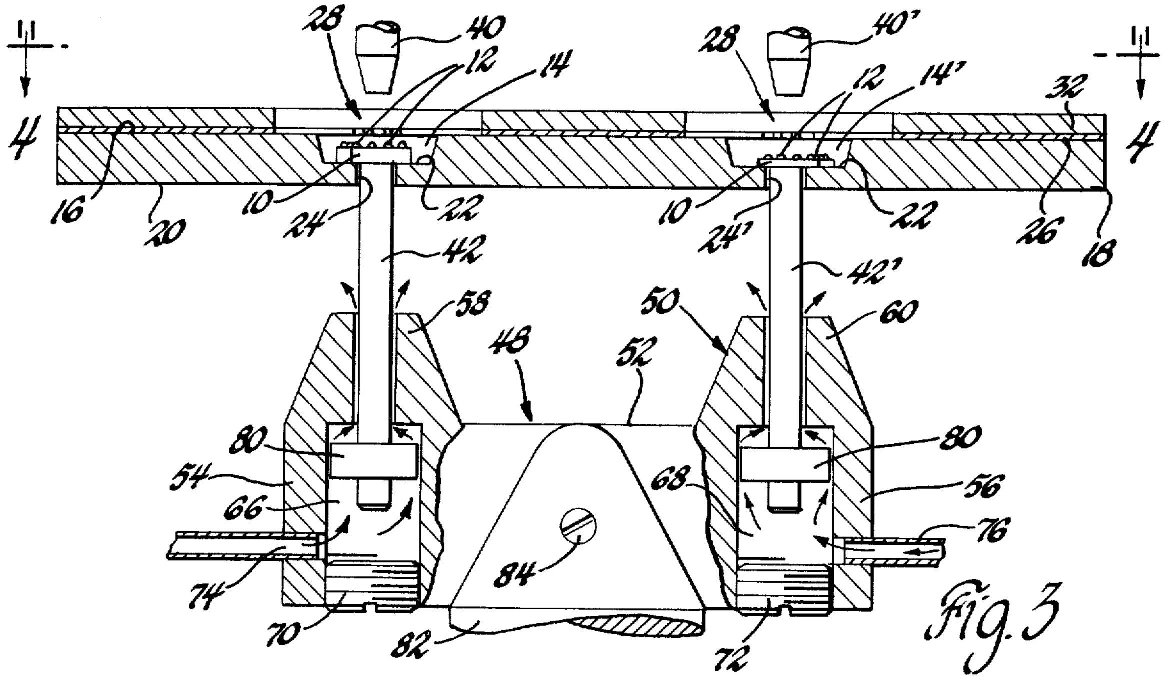
FIG. 3 shows a view of the apparatus shown in FIG. 2 engaging the backside of two semiconductor chips.
Figure 4:
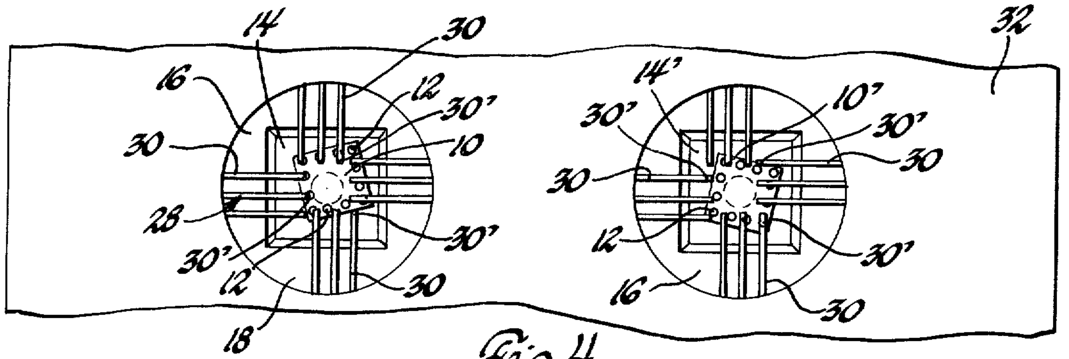
FIG. 4 shows a top plan view along the lines 4—4 of FIG. 3.

According to the method of our invention, the automatic indexing mechanism 38 positions the template 10 in the direction of arrows of FIG. 1 so that the openings 24 and 24' of adjacent recesses are vertically aligned between the hot gas tubes 40, 40' and probes 42, 42'. As can be seen in FIGS. 3 and 4 the flip chips 10 and 10' within the template recesses will probably be slightly misaligned with their overlying corresponding set of lead frame fingers 30.

Figure 5:
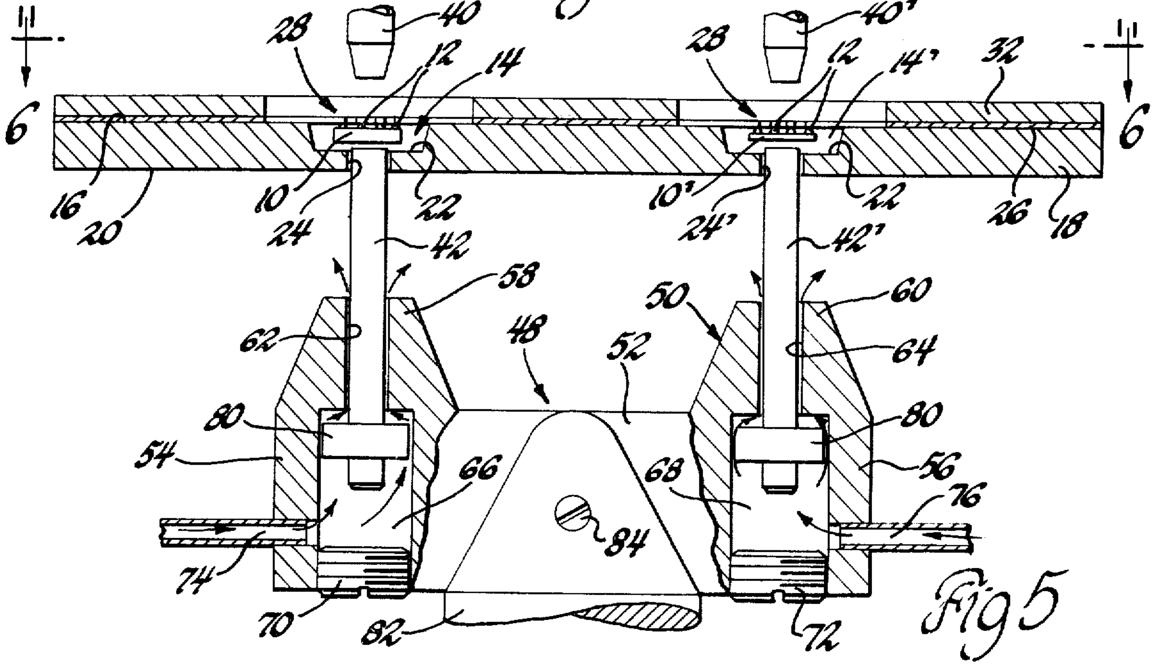
FIG. 5 shows a view of the apparatus shown in FIG. 2 after chip transfer to a lead frame.
Figure 6:
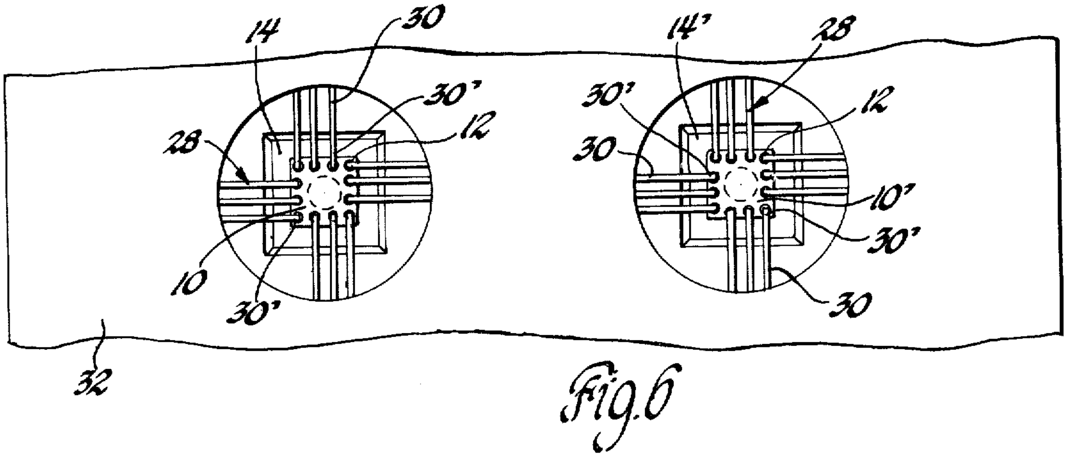
FIG. 6 shows a top plan view along the lines 6—6 of FIG. 5.

After the probes 42, 42' and adjacent template recess openings 24, 24' are aligned, switch 102 is closed to energize the electromagnet coil 98. The lever arm 94 is slowly depressed by activation of the automatic lever depression control 104 to raise the transfer apparatus so that the air biased probes enter the adjacent recess openings to engage the backsides of the chips therein as can be seen in FIG. 3. Further depression of lever arm 94 causes the probes to lift the chips off of the template recess bottom portions. The probes carry the chip within close proximity of their overlying sets of lead frame fingers 30. When each chip is brought close enough to the underside of the fingers, the magnetic force from the electromagnet coil 98 propels the chip the rest of the way to the underside of the fingers 30, as can be seen in FIG. 5. In moving from the probe toward the fingers, the chips are also concurrently automatically oriented by magnetic flux lines concentrated in the lead frame fingers in the chip contact bump so that when the contact bumps engage their respective fingers they are precisely aligned therewith, as shown more clearly in FIG. 6. Some orientation can occur before the chip even raises off the probe but will always occur before the contact bump 12 engages their respective fingers. Just how close each chip must be brought to the overlying lead frame depends on various factors, such as the strength of the magnetic field from the electromagnet, the concentration of flux lines in the areas of the chip and overlying fingers, the size and weight of each chip, the size of the lead frame fingers, etc. Depending upon the variables, the contact bumps may have to be brought vertically to within only about 8 mils of the fingers or as close as 2 mils before it will raise and orient. Hence, if the distance between the underside of the fingers and the top of the contact bump varies in adjacent recesses, each chip may raise and orient at different times.

Further, depression of the lever arm 94 vertically raises the probes 42, 42' so that they re-engage the backside of the chips 10, 10' that are already in aligned engagement with their corresponding lead frame fingers.

Figure 7:
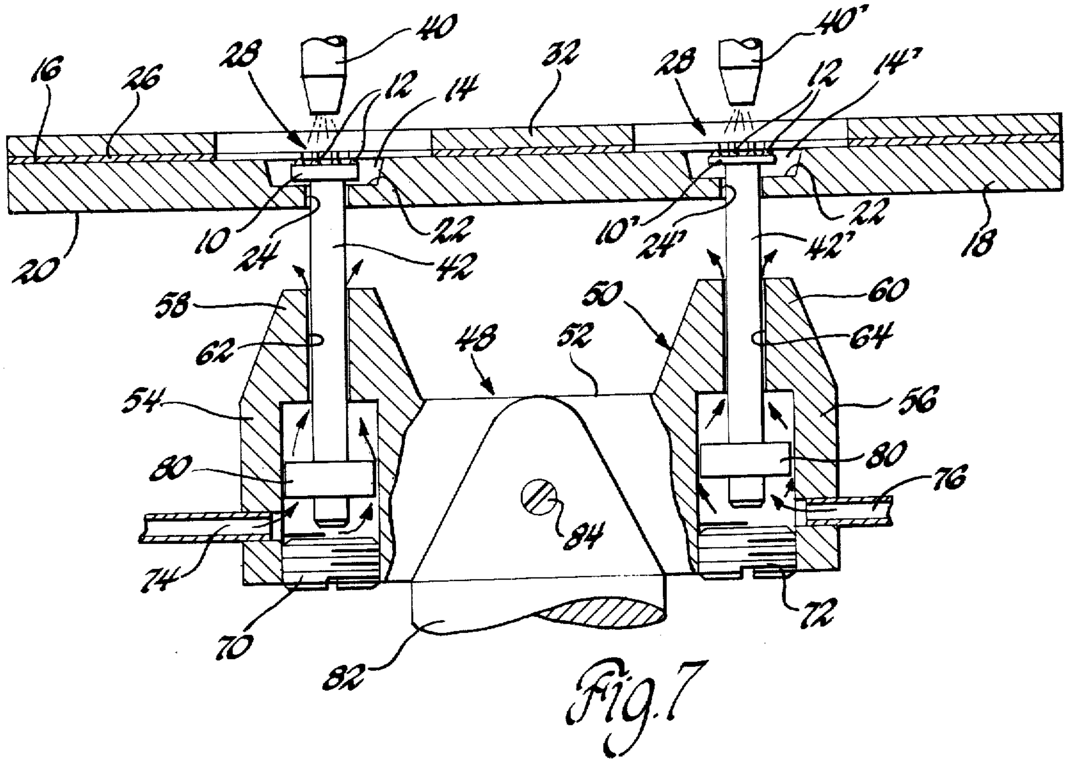
FIG. 7 shows a view of the apparatus shown in FIG. 2 re-engaging the backside of the chips.

Since in this example flip chip 10 is shown thicker than flip chip 10', the probes 42, 42' will not re-engage their respective chips simultaneously. Probe 42 will re-engage its chip 10 before probe 42'. Continued upward movement of the probe assembly 48 then produces re-engagement of probe 42' with its chip 10'. In the meantime, the first probe 42 is free to regress within its chamber, against a predetermined back pressure of air. On continued upward movement of the probe assembly 48, to insure positive re-engagement of both chips, the second probe similarly regresses within its chamber. Thus, in normal operation, as can be seen in FIG. 7, both probes 42 and 42' partially regress within their chambers once they have re-engaged the backside of their chips. The back pressure of air applied to the probe is only sufficient to provide effective chip support during the blast of hot gas for bonding. However, it is insufficient to significantly elevate the chip further. Hence, the probes do not upwardly bend the lead frame fingers 30 after re-engaging the chips, as would be the case if the probes were rigidly mounted.

Once the chips have been magnetically aligned and the probes have re-engaged the chips to hold them in register, the chips are simultaneously permanently bonded to the lead frame by hot gas from the hot gas tubes 40 and 40'. The hot gas is supplied from hot gas source 46 which typically provides a nitrogen and hydrogen gas mixture at a temperature of approximately 500°C. Since the probes are holding the chips in register against their corresponding lead frame fingers, the force from the hot gas blast will not disturb the precision alignment, even if the blast is accelerated to increase the speed of bonding. The hot gas melts the tin in the contact bumps, and the gold outer surfaces of the contact bumps and fingers dissolve in the tin to form a melt. The hot gas is then removed and the melt resolidifies to form a permanent electrical and mechanical connection between the chip contact bumps 12 and the lead frame fingers 30.

To repeat the cycle the transfer apparatus is lowered by releasing the downward pressure on lever arm 82 so that the probes 42 and 42' recede beneath the template surface 20. The automatic indexing mechanism 38 then positions the template so that the openings of the next adjacent row of template recesses are vertically aligned above the probes 42 and 42'. The probes are then raised by the automatic lever depression control 104 as hereinbefore described to engage the chips within the next recesses to align and hold the chips in register while they are bonded to their corresponding lead frame fingers.

Figure 8:
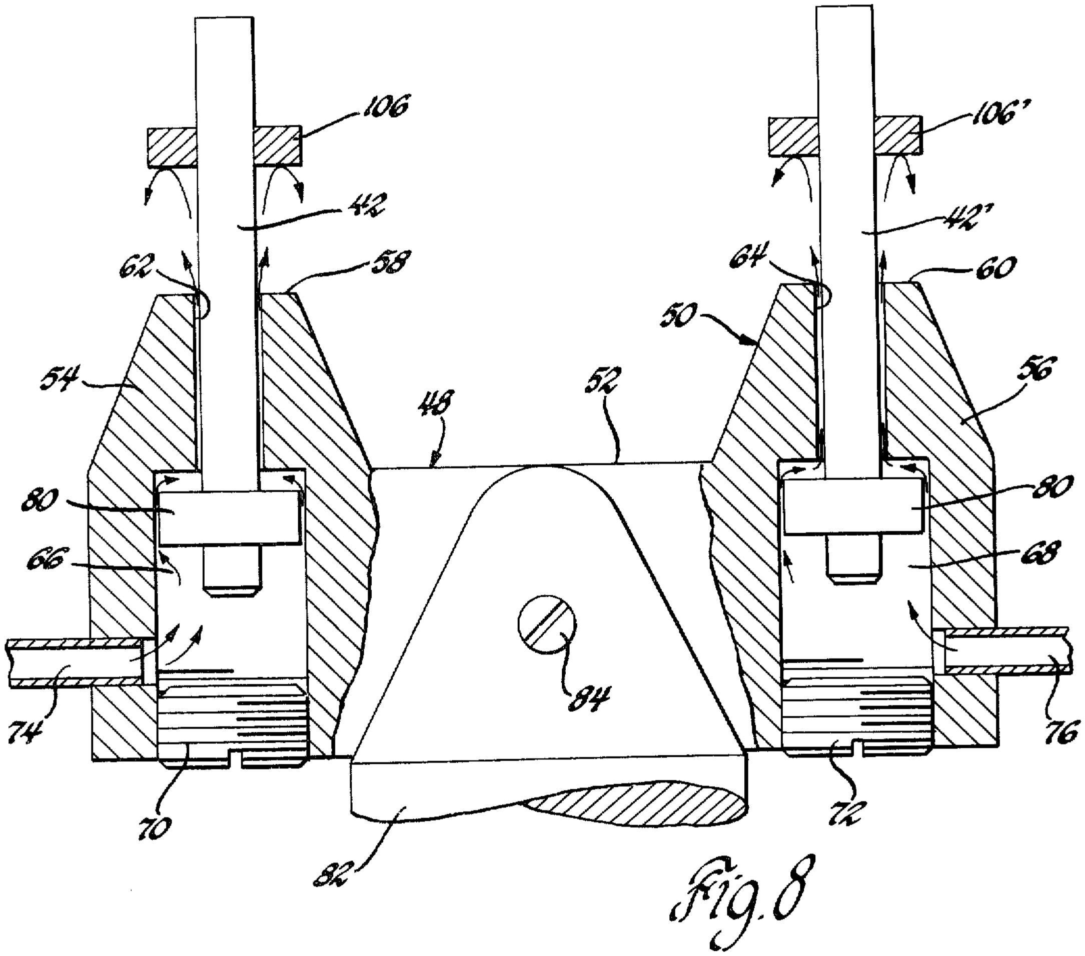
FIG. 8 shows an enlarged fragmentary sectional view in partial elevation similar to FIG. 2 with the addition of air deflection means.

In some applications in which the flip chips are extremely lightweight, air deflection plates 106 and 106' can be attached to the probes 42 and 42', respectively, to divert the air escaping from orifices 62 and 64. The air deflection plates 106 and 106' are constructed of a nonferromagnetic material such as copper or brass, and in this example are spaced about 0.125 inch from the uppermost tip of the probes. As can be seen in FIG. 8 the air deflector plates 106 and 106' divert the air escaping from orifices 62 and 64 away from the flip chip. Thus, there is no direct impingement of air from orifices 62 and 64 on the flip chips to disturb their magnetically aligned bonding position.

It should be understood that although this invention has been described in connection with particular examples thereof, no limitation is intended thereby except as defined in the appended claims.

What is claimed is:

1. A self-aligning method of automatically transferring integrally leaded semiconductor device chips to a conductive lead frame and for automatically consistently producing uniform low stress bonds therebetween, said method comprising:

inserting a semiconductive device chip into each of a plurality of spaced recesses in an upper surface of a carrier template, each of said chips having a face with a plurality of soft ferromagnetic integral leads thereon, with each of said chip faces being oriented upwardly;

supporting on said template upper surface a conductive lead frame having a plurality of soft ferromagnetic finger sets in register over corresponding template recesses, with said fingers corresponding to said integral chip leads;

raising said chips on soft ferromagnetic supports into close proximity with the underside of their overlying finger sets;

magnetically raising said chips up off their supports into engagement with their overlying finger sets and precisely aligning them therewith;

re-engaging the backside of the chips with their respective supports without further significantly elevating said chips and overstressing said lead frame fingers;

flowing a hot gas onto said finger sets and said chips while said chips are in re-engagement with their respective supports to bond said integral chip leads to their corresponding lead frame fingers without disturbing said precise alignment therebetween;

terminating said flow of hot gas; and withdrawing the supports from said chips.

2. A self-aligning method of automatically transferring integrally leaded semiconductor device chips to a conductive lead frame and for automatically consistently producing uniform low stress bonds therebetween, said method comprising:

placing a semiconductor device chip having a face with a plurality of soft ferromagnetic integral leads thereon into each of adjacent recesses in an upper surface of a carrier template so that said chip faces are oriented upwardly, said template recesses having openings extending to a lower surface of the template;

supporting on said template upper surface a conductive lead frame having sets of a plurality of soft ferromagnetic fingers corresponding to said integral chip leads wherein a finger set overlies each chip in the template recesses;

forcing an air pressure into a chamber to bias a plurality of soft ferromagnetic probes slidably mounted therein and extending vertically therefrom, said probes being spaced apart equivalent to the distance between the openings of adjacent template recesses;

applying a magnetic force to the probes so that magnetic lines of flux flow longitudinally therethrough;

extending the probes through the openings of adjacent template recesses to engage the backside of the chips therein;

raising the chips closer to the overlying lead frame fingers until the magnetic force transmitted through the probe precisely aligns the integral chip leads with their corresponding fingers and further raises the chips up from the probes to the fingers to produce engagement between all of the integral chip leads of each chip and their corresponding lead frame fingers;

re-engaging the backside of the chips with the probes to hold the chips in register with their corresponding lead frame finger sets, said probes being partially regressed into said chamber so as not to upwardly bend the lead frame fingers upon re-engagement; and heating said integral chip leads and said fingers in engagement therewith with a blast of hot gas to simultaneously bond the chips to their respective lead frame finger sets without disturbing said precisely aligned engagement therebetween.

3. Apparatus for automatically consistently producing uniform low stress bonds between integrally leaded semiconductor device chips and a conductive lead frame, said apparatus comprising:

a temporary semiconductor device carrying template having a plurality of spaced recesses in an upper surface thereof, said template recesses having openings extending to an opposite surface of the template;

means for supporting on said one template surface a conductive lead frame having a plurality of spaced finger sets so that each of said finger sets overlies a template recess, said finger sets having a plurality of spaced mutually convergent soft ferromagnetic fingers corresponding to integral leads on a semiconductor device chip;

a transfer apparatus having a soft ferromagnetic vertically extending member, means for applying a magnetic force to said member, means for successively vertically raising said member and magnetic means, and means on one end of said member for receiving a probe holding apparatus;

a probe holding apparatus for mounting onto said member receiving means, said probe holding apparatus having a soft ferromagnetic housing defining a cylinder, a cavity in the cylinder, an orifice extending vertically from the cavity to the periphery of the housing, a soft ferromagnetic probe slidably mounted in the orifice and extending therefrom, and an opening extending from the periphery of the housing into the cavity for introducing a differential air pressure therein;

an air pressure source connected to said opening for forcing an air pressure into the cavity to vertically bias said probe, said probe being so biased that it is capable of carrying a semiconductor device chip in a template recess into close proximity with its overlying lead frame finger sets so that the magnetic force can automatically orient and transfer it from the probe into engagement with the fingers, but so that the probe will partially regress into the cavity so as to not bend the fingers after re-engaging the backside of the chip to hold it in register with the fingers; and means for flowing a hot gas onto said chip-finger engagement while the backside of the chip is re-engaged with said probe without disturbing the precise integral chip lead-finger registration.

4. The apparatus of claim 3 which includes means on said probe for deflecting air escaping from said orifice.

* * * * *